(12) United States Patent
Cai et al.

(10) Patent No.: US 11,054,387 B2
(45) Date of Patent: Jul. 6, 2021

(54) SEMICONDUCTOR DEVICES WITH ION-SENSITIVE FIELD EFFECT TRANSISTOR

(71) Applicant: GLOBALFOUNDRIES Singapore Pte. Ltd., Singapore (SG)

(72) Inventors: Xinshu Cai, Singapore (SG); Shyue Seng Tan, Singapore (SG); Eng Huat Toh, Singapore (SG)

(73) Assignee: GLOBALFOUNDRIES Singapore Pte. Ltd., Singapore (SG)

( * ) Notice: Subject to any disclaimer, the term of this patent is extended or adjusted under 35 U.S.C. 154(b) by 0 days.

(21) Appl. No.: 16/548,791

(22) Filed: Aug. 22, 2019

(65) Prior Publication Data

US 2021/0055256 A1 Feb. 25, 2021

(51) Int. Cl.
*H01L 21/28* (2006.01)
*G01N 27/414* (2006.01)

(52) U.S. Cl.
CPC ... *G01N 27/4148* (2013.01); *H01L 21/28026* (2013.01)

(58) Field of Classification Search
CPC .............. G01N 27/4148; G01N 27/414; H01L 21/28026; H01L 29/788–7889; H01L 29/66825; H01L 27/11551–11556
See application file for complete search history.

(56) References Cited

U.S. PATENT DOCUMENTS

| | | | | |
|---|---|---|---|---|
| 2009/0127589 A1* | 5/2009 | Rothberg | ........... | G01N 27/4148 257/253 |
| 2011/0272764 A1* | 11/2011 | Kim | .................. | H01L 29/66545 257/368 |
| 2016/0265047 A1* | 9/2016 | van Rooyen | ...... | G01N 27/4146 |
| 2017/0067849 A1* | 3/2017 | Cobianu | ........... | H01L 29/66977 |
| 2018/0372679 A1* | 12/2018 | Ayele | .................. | G01N 27/4148 |
| 2019/0202206 A1* | 7/2019 | Ge | .......................... | B41J 2/2142 |

OTHER PUBLICATIONS

Massimo Barbaro et al.; A Charge-Modulated FET for Detection of Biomolecular Processes: Conception, Modeling, and Simulation; IEEE Transactions on Electron Devices; Jan. 2006; 158-166; vol. 53, No. 1, IEEE, US.
Baozhen Chen et al.; Biochemical Sensing of Charged Polyelectrolytes with a Novel CMOS Floating-gate Device Architecture; 2008; 300-303; IEEE, US.
Baozhen Chen et al.; Folded Floating-Gate CMOS Biosensor for the Detection of Charged Biochemical Molecules; IEEE Sensors Journal; Nov. 2011; 2906-2910; vol. 11, No. 11, IEEE, US.
Peng-Chun Liou et al.; High Resolution Ion Detector (HRID) by 16nm FinFET CMOS Technology; 2018, 1-4; IEEE, US.

* cited by examiner

*Primary Examiner* — Shahed Ahmed
(74) *Attorney, Agent, or Firm* — David Cain

(57) ABSTRACT

The present disclosure generally relates to semiconductor devices, and more particularly to semiconductor devices integrated with an ion-sensitive field-effect transistor (IS-FET) and methods of forming the same. The semiconductor device may include a substrate, a reference gate structure disposed above the substrate, a floating gate structure disposed above the substrate and adjacent to the reference gate structure, where the reference gate structure is electrically coupled to the floating gate structure, and a dielectric layer disposed between the reference gate structure and the floating gate structure.

18 Claims, 8 Drawing Sheets

SEMICONDUCTOR DEVICES WITH ION-SENSITIVE FIELD EFFECT TRANSISTOR

FIELD OF THE INVENTION

The disclosed subject matter relates generally to semiconductor devices, and more particularly to semiconductor devices integrated with an ion-sensitive field-effect transistor (ISFET) and methods of forming the same.

BACKGROUND

Semiconductor devices and integrated circuit (IC) chips have found numerous applications in the fields of chemistry and biology (more generally, "life sciences"), especially for detection and measurement of various chemical and biological reactions and identification, detection and measurement of various compounds. One such device that can be used in the above-mentioned applications is an ISFET.

ISFETs may be used to facilitate measurement of the ion concentration of a solution or an electrolyte (i.e., pH value). ISFETs may include components such as a reference electrode (also known as a control gate or a reference gate) and an ion-sensitive sensor for the detection of charged particles. The reference electrode is required in order to determine the charged particle concentration from a defined voltage. During operation of an ISFET, the reference electrode defines the electrolyte potential to set the operating point for measuring the potential difference of the ionic solution.

Conventional reference electrodes may include a standard hydrogen electrode and a silver chloride electrode (i.e., Ag/AgCl electrode). Such materials are not typically used in a standard complementary metal-oxide semiconductor (CMOS) process technology, and the integration of such conventional reference electrodes into the CMOS process technology is found to involve the use of complex and costly fabrication tools and involves several difficulties. For example, conventional reference electrodes have large dimensions in comparison with semiconductor device components. Additionally, miniaturized reference electrodes have limited lifetime when integrated into a CMOS device (as the electrolyte solution in the reference electrode cannot be replenished once exhausted).

With the semiconductor industry's drive for higher density, higher performance, lower-cost devices and the implementation of nanometer-scale process nodes, there is a need to provide semiconductor devices that can overcome, or at least ameliorate, one or more of the disadvantages as described above.

SUMMARY

In an aspect of the present disclosure, there is provided a semiconductor device having a substrate, a reference gate structure disposed above the substrate, a floating gate structure disposed above the substrate and adjacent to the reference gate structure, where the reference gate structure is electrically coupled to the floating gate structure, and a dielectric layer disposed between the reference gate structure and the floating gate structure.

In another aspect of the present disclosure, there is provided a semiconductor device having a substrate, source and drain regions and an isolation structure disposed on the substrate, a floating gate structure extending laterally to include a first portion above the isolation structure and a second portion above and between the source and drain regions, a reference gate structure disposed above the isolation structure and laterally surrounding the first portion of the floating gate structure, where the reference gate structure is electrically coupled to the floating gate structure, and a dielectric layer disposed between the reference gate structure and the first portion of the floating gate structure.

In yet another aspect of the present disclosure, there is provided a method of forming a semiconductor device by providing a substrate and forming an isolation structure on the substrate, forming a reference gate structure above the isolation structure, forming a dielectric layer covering the isolation structure and side surfaces of the reference gate structure, and forming a floating gate structure extending laterally to include a first portion and a second portion on the dielectric layer, where the first portion of the floating gate structure is adjacent to the side surfaces of the reference gate structure and separated by the dielectric layer therebetween.

BRIEF DESCRIPTION OF THE DRAWINGS

The present disclosure may be understood by reference to the following description taken in conjunction with the accompanying drawings.

For simplicity and clarity of illustration, the drawings illustrate the general manner of construction, and certain descriptions and details of well-known features and techniques may be omitted to avoid unnecessarily obscuring the discussion of the described embodiments of the present disclosure. Additionally, elements in the drawings are not necessarily drawn to scale. For example, the dimensions of some of the elements in the drawings may be exaggerated relative to other elements to help improve understanding of embodiments of the present disclosure. The same reference numerals in different drawings denote the same elements, while similar reference numerals may, but do not necessarily, denote similar elements.

FIG. 3A is a plan view and FIG. 3B is a cross-sectional view depicting a device structure for forming a semiconductor device, in accordance with embodiments of the present disclosure. FIG. 3B is a cross-sectional view taken along section line Y-Y' in FIG. 3A.

FIG. 4A is a plan view and FIG. 4B is a cross-sectional view depicting the formation of a reference gate structure above the device structure of FIGS. 3A and 3B, in accordance with embodiments of the present disclosure. FIG. 4B is a cross-sectional view taken along section line Y-Y' in FIG. 4A.

FIG. 5A is a plan view and FIG. 5B is a cross-sectional view depicting the formation of a dielectric layer and a floating gate structure above the device structure of FIGS. 4A and 4B, in accordance with embodiments of the present disclosure. FIG. 5B is a cross-sectional view taken along section line Y-Y' in FIG. 5A.

DETAILED DESCRIPTION

Various illustrative embodiments of the present disclosure are described below. The embodiments disclosed herein are exemplary and not intended to be exhaustive or limiting to the present disclosure.

Figure 1:
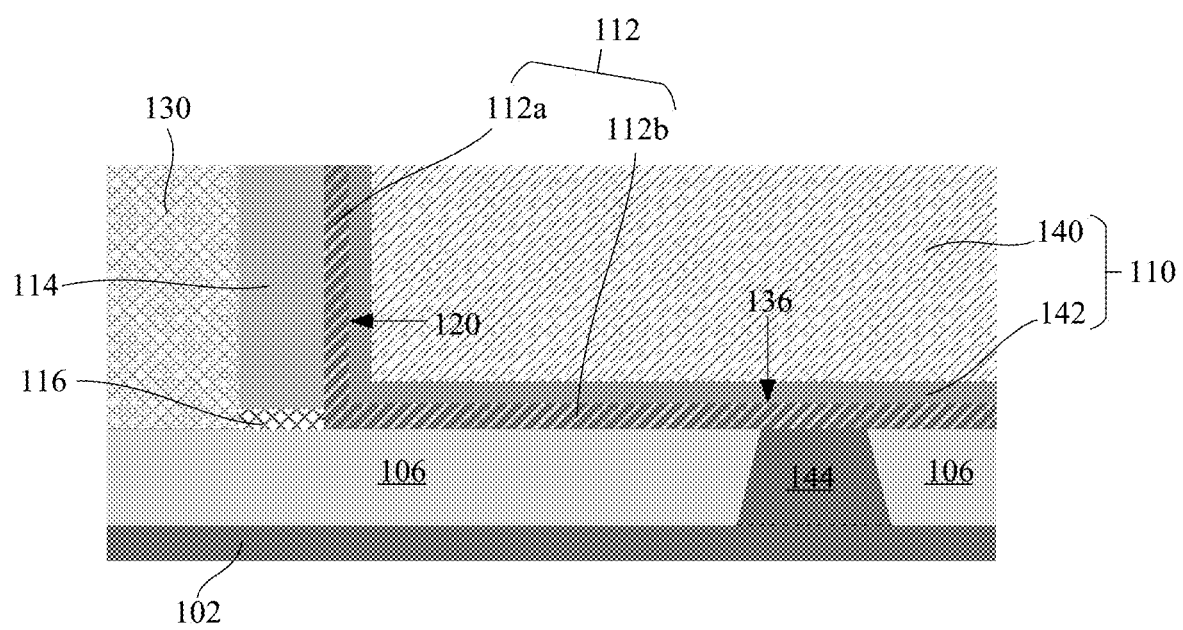
FIG. 1 is a cross-sectional view of an exemplary semiconductor device in accordance with embodiments of the present disclosure.

Referring to FIG. 1, a cross-sectional view of an exemplary semiconductor device is shown. The device may include an isolation structure 106 disposed on the substrate 102. Conventional IC components such as bipolar junction transistors (BJTs) and field-effect transistors (FETs) may be built on the substrate 102. The isolation structure 106 may function as an electrical insulator and serves to prevent electrical shorts between the IC components. The isolation structure 106 can be a shallow trench isolation region or a deep trench isolation region. Additionally, an active region 144 may be disposed on the substrate 102 and adjacent to the isolation structure 106. The active region 144 may include source and drain regions and diffusion regions (i.e., a channel for current flow across the source and drain regions).

The substrate 102 and the active region 144 may be made of any semiconductor material, such as silicon, germanium, silicon germanium (SiGe), silicon carbide, and those consisting essentially of III-V compound semiconductors, such as GaAs, II-VI compound semiconductors such as ZnSe. The substrate 102 may also be a semiconductor-on-insulator substrate or a bulk semiconductor substrate. Examples of a semiconductor-on-insulator substrate may include, but not limited to, an organic semiconductor or a layered semiconductor, such as Si/SiGe, a silicon-on-insulator (SOI), a germanium-on-insulator (GOI), or a SiGe-on-insulator. A portion or the entire semiconductor substrate 102 may be amorphous, polycrystalline, or monocrystalline.

The substrate 102 may include a P-type well, an N-type well, or a combination of N-type and P-type wells. Formation of P-type and/or N-type wells may be formed in the substrate 102; for example, by doping using an ion implantation technique with the use of an implantation mask and with a dopant of a conductivity type, such as an N-type dopant (e.g. arsenic, phosphorus, or antimony) or a P-type dopant (e.g. boron, aluminum, or gallium).

The device also includes a floating gate structure 110 disposed above the substrate 102, a reference gate structure 114 disposed above the substrate 102 and adjacent to the floating gate structure 110 and a dielectric layer 112 disposed between the reference gate structure 114 and the floating gate structure 110. The floating gate structure 110 is electrically coupled to the reference gate structure 114 through the dielectric layer 112. An insulating layer 130 (e.g., silicon oxide) may also be disposed above the substrate 102 and surrounds the device components. The insulating layer 130 may serve as an interlayer dielectric (ILD).

The coupling efficiency between the floating gate structure 110 and reference gate structure 114 may be assessed based on a coupling ratio. A higher coupling ratio indicates an increased electrical coupling between the two structures, and improves the transfer of electrical energy. The coupling ratio may be calculated using the capacitance values of the floating gate structure 110 and reference gate structure 114. Advantageously, the use of the dielectric layer 112 to couple the floating gate structure 110 and reference gate structure 114 is found to achieve higher coupling ratios.

The dielectric layer 112 may be a gate dielectric layer having a high-K dielectric material. The term "high-K" as used herein refers to a material having a dielectric constant (i.e., K value) that is greater than 4, preferably in the range of about 4 to about 25. The high-K dielectric material may include, but not limited to, hafnium oxide ($HfO_2$), zirconium oxide ($ZrO_2$), lanthanum oxide ($La_2O_3$), aluminum oxide ($Al_2O_3$), titanium oxide ($TiO_2$), strontium titanium oxide ($SrTiO_3$), lanthanum aluminum oxide ($LaAlO_3$), yttrium oxide ($Y_2O_3$), hafnium oxynitride ($HfO_xN_y$), zirconium oxynitride ($ZrO_xN_y$), lanthanum oxynitride ($La_2O_xN_y$), aluminum oxynitride ($Al_2O_xN_y$), titanium oxynitride ($TiO_xN_y$), strontium titanium oxynitride ($SrTiO_xN_y$), lanthanum aluminum oxynitride ($LaAlO_xN_y$), yttrium oxynitride ($Y_2O_xN_y$), a silicate thereof, and an alloy thereof. Each value of x is independently from 0.5 to 3 and each value of y is independently from 0 to 2. The dielectric layer 112 may have a thickness in the range of about 1 nm to about 3 nm.

The dielectric layer 112 may function as a coupling layer between the reference gate structure 114 and the floating gate structure 110 as well as a gate dielectric layer for modulating the conductance of the channel between the source and drain regions. The dielectric layer 112 may have a vertical section layer 112a and a horizontal section layer 112b. As shown in FIG. 1, the floating gate structure 110 is disposed on the dielectric layer 112 such that the vertical section layer 112a is between the reference gate structure 114 and a terminal end surface 120 of the floating gate structure 110, and the horizontal section layer 112b is between a bottom surface 136 of the floating gate structure 110 and the isolation structure 106 and the active region 144. Advantageously, the coupling ratio may be increased by configuring the dielectric layer 112 to have the vertical 112a and horizontal 112b section layers as described above.

The floating gate structure 110 may function as a gate for controlling the current flow between the source and drain terminals of an ISFET. The reference gate structure 114 may function as a control gate or a reference electrode being connected to a pre-set reference voltage and couples a voltage to the floating gate structure 110 through the dielectric layer 112.

As shown in FIG. 1, the reference gate structure 114 and a portion of the floating gate structure 110 is disposed above the isolation structure 106. The floating gate structure 110 also extends laterally to have another portion disposed above the active region 144. In some embodiments, a dielectric liner 116 (e.g., silicon oxide liner) is disposed between the reference gate structure 114 and the isolation structure 106.

The reference gate structure 114 may include a semiconductor electrode, such as polysilicon or amorphous silicon. The floating gate structure 110 may include a metal electrode 140 and a work-function material (WFM) layer 142. The WFM layer 142 may be disposed on the dielectric layer 112, while the metal electrode 140 may be disposed on the WFM layer 142.

The metal electrode 140 may be made of an electrically conductive material. Examples of electrically conductive materials for the metal electrode may include, but not limited to, tungsten, cobalt, nickel, copper, aluminum.

The WFM layer 142 may include any metallic compound or a composition of metallic compounds capable of modifying the work function property of a gate. Examples of metallic compounds may include, but not limited to, Hf, Ti, Zr, Cd, La, Tl, Yb, Al, Ce, Eu, Li, Pb, Tb, Bi, In, Lu, Nb, Sm, V, Zr, Ga, Mg, Gd, Y, TiAl, TaN, Pt, Rh, Ir, Ru, Cu, Os, Be, Co, Pd, Te, Cr, Ni, a stack thereof, a conductive oxide thereof, a conductive nitride thereof, an alloy thereof, and a combination thereof.

FIGS. 2A to 2E are illustrative examples of the reference gate structure 114 being adjacent to the floating gate structure 110.

Figure 2A:
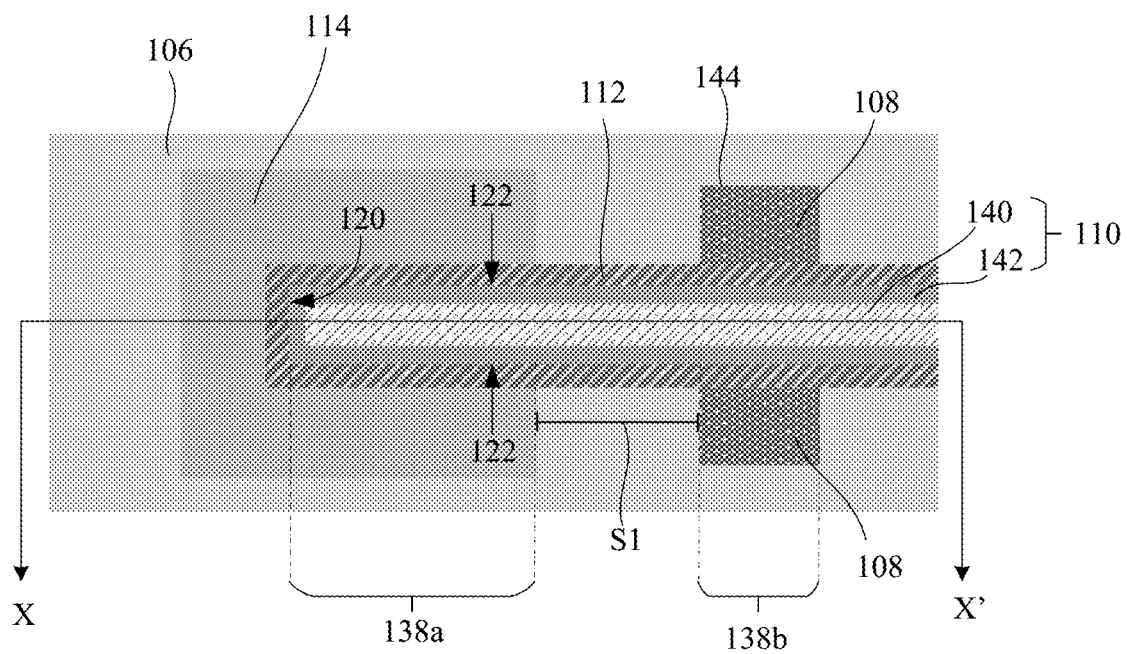
FIGS. 2A to 2E are plan views of a semiconductor device, in accordance with embodiments of the present disclosure.

Referring to FIG. 2A, an illustration of the layout of components in the exemplary semiconductor device is shown. The line X-X' indicates the cross-section line in which the view shown in FIG. 1 is taken from. In a simplified view, the insulating layer 130 and the substrate 102 are not shown. As shown in FIG. 2A, the floating gate structure 110 extends laterally to have a first portion 138a above the isolation structure 106 and a second portion 138b above and between the source and drain regions 108. Preferably, the first portion 138a of the floating gate structure 110 is laterally surrounded by the reference gate structure 114.

The reference gate structure 114 is spaced apart from the active region 144 and the source and drain regions 108 by a spacing S1. The spacing S1 may be defined to have a minimum distance in order to prevent the reference gate structure 114 from adversely affecting the control of the current flow in the active region 144 (e.g., electrical interference from the reference voltage of the reference gate structure 114 on the active region 144) and to avoid an electrical short between the source and drain regions 108 and the reference gate structure 114. As an illustrative example, the spacing S1 can have a minimum distance of 0.04 µm between the active region 144 and the reference gate structure 114.

In the embodiment shown in FIG. 2A, the floating gate structure 110 has a terminal end surface 120 and side surfaces 122. The reference gate structure 114 laterally surrounds the terminal end surface 120 and side surfaces 122 of the first portion 138a of the floating gate structure 110. Additionally, the dielectric layer 112 is disposed on the side surfaces 122, the bottom surface (not shown) and the terminal end surface 120 of the floating gate structure 110.

Advantageously, by laterally surrounding the first portion 138a of the floating gate structure 110 with the reference gate structure 114, it is found that the surface area contact between the dielectric layer 112, the reference gate structure 114 and the floating gate structure 110 is maximized, thereby improving the coupling between the reference gate structure and the floating gate structure.

Figure 2B:
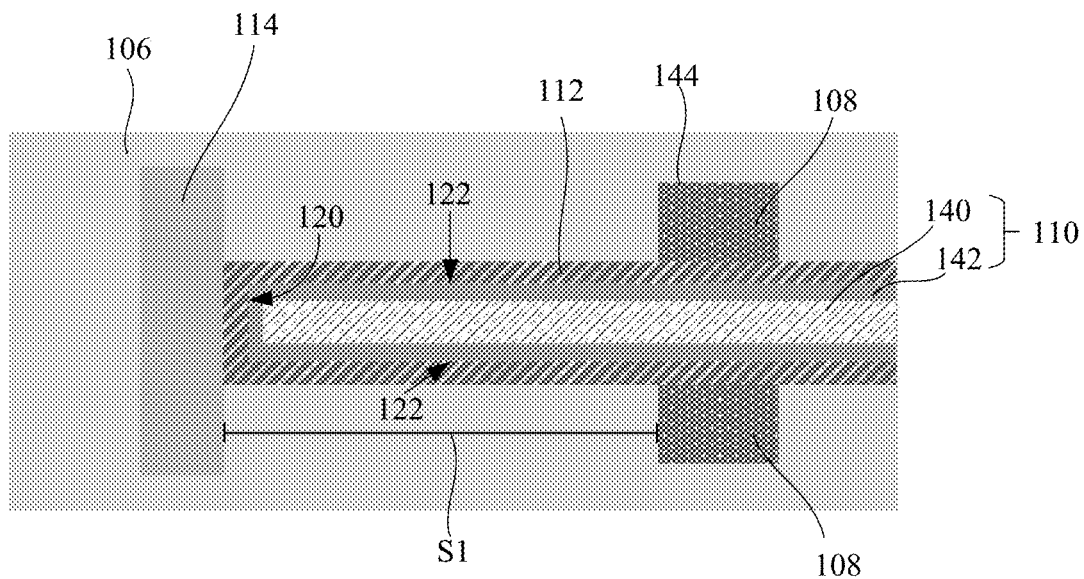

FIG. 2B illustrates an alternative embodiment of FIG. 2A. In FIG. 2B, the reference gate structure 114 is adjacent to the terminal end surface 120 of the floating gate structure 110 only.

Figure 2C:
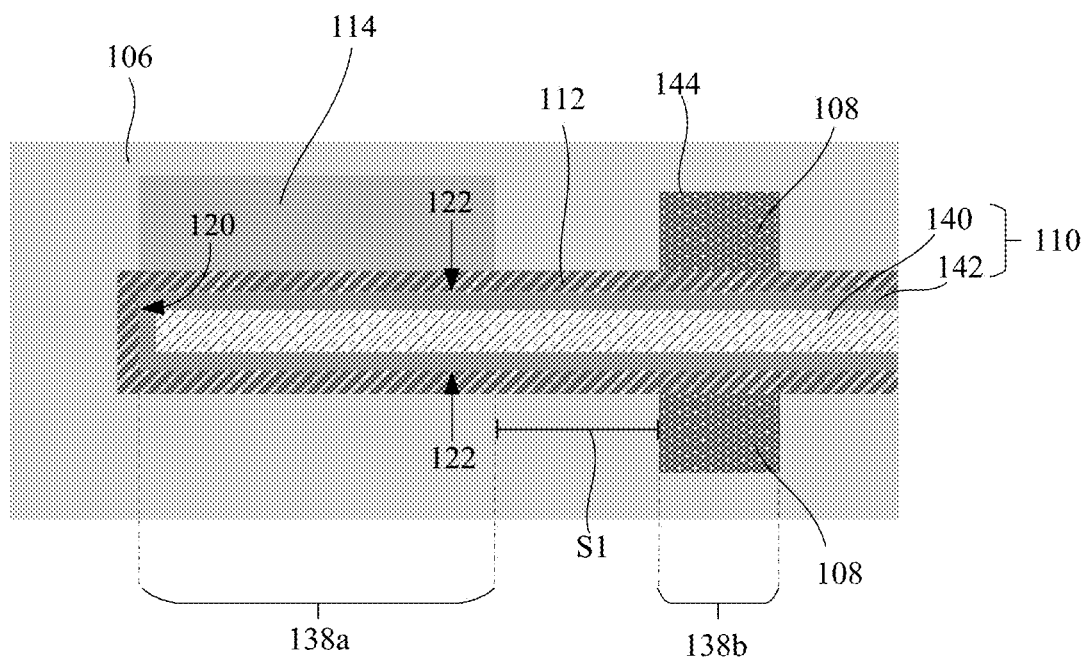

FIG. 2C illustrates another alternative embodiment of FIG. 2A. In FIG. 2C, the reference gate structure 114 is adjacent to a side surface 122 of the first portion 138a of the floating gate structure 110 only.

Figure 2D:
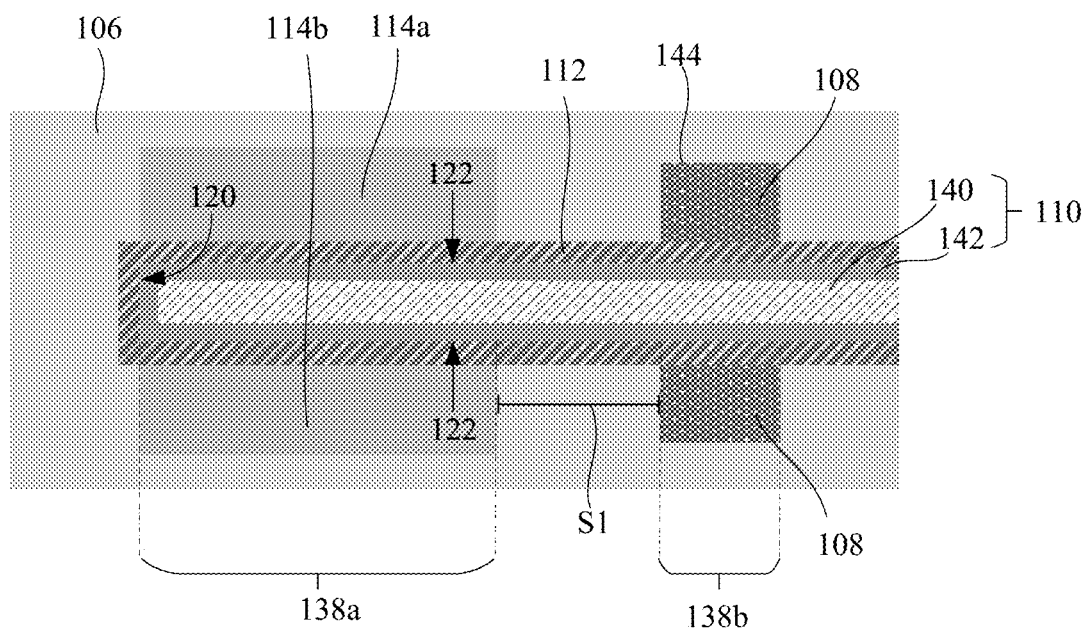

FIG. 2D illustrates another alternative embodiment of FIG. 2A. In FIG. 2D, both side surfaces 122 of the floating gate structure 110 are adjacent to a first 114a and a second 114b reference gate structures.

Figure 2E:
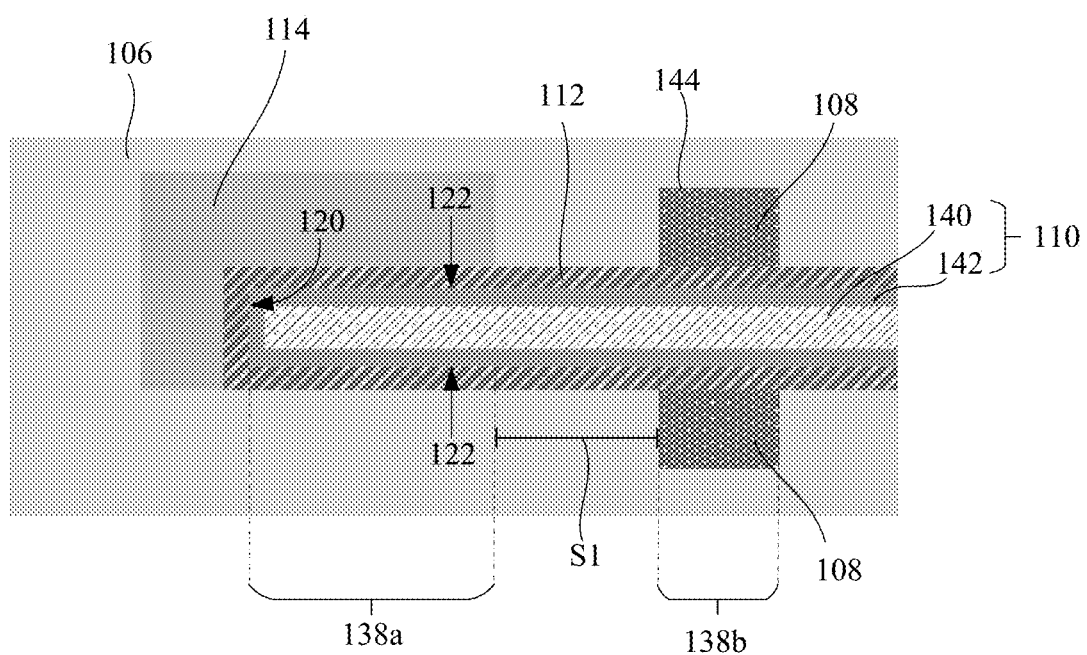

FIG. 2E illustrates another alternative embodiment of FIG. 2A. In FIG. 2E, the reference gate structure 114 is adjacent to the terminal end 120 and one of the side surfaces 122 of the first portion 138a of the floating gate structure 110 only.

Advantageously, the placement of the reference gate structure 114 above the isolation structure 106 (instead of diffusion regions in the substrate) avoids loss in coupling ratio between the reference gate structure 114 and the floating gate structure 110 due to parasitic capacitance.

Figure 3A:
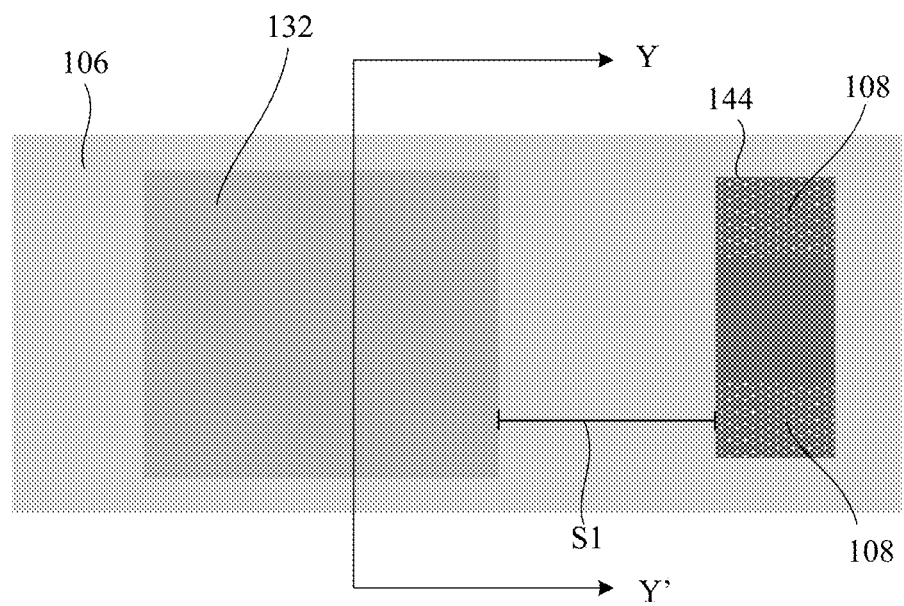
FIGS. 3A and 3B, FIGS. 4A and 4B, and FIGS. 5A and 5B illustrate various stages of forming a semiconductor device in accordance with embodiments of the present disclosure.
Figure 3B:
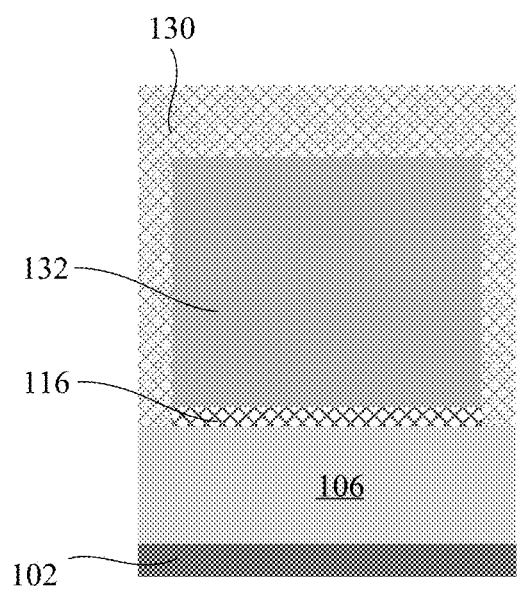

Referring to FIG. 3A and FIG. 3B, a "base" device structure for forming a semiconductor device of the present disclosure is shown. FIG. 3A illustrates the layout configuration of this starting device structure, while FIG. 3B illustrates the cross-sectional view taken along section line Y-Y' in FIG. 3A.

As used herein, "deposition techniques" refer to the process of applying a material over another material (or the substrate). Exemplary techniques for deposition include, but not limited to, spin-on coating, sputtering, chemical vapor deposition (CVD), physical vapor deposition (PVD), molecular beam deposition (MBD), pulsed laser deposition (PLD), liquid source misted chemical deposition (LSMCD), atomic layer deposition (ALD). "Epitaxy techniques" refers to the process of forming a material over another material using molecular beam epitaxy (MBE), liquid phase epitaxy, vapor phase epitaxy, solid phase epitaxy, or rapid melt growth.

Additionally, "patterning techniques" includes deposition of material or photoresist, patterning, exposure, development, etching, cleaning, and/or removal of the material or photoresist as required in forming a described pattern, structure or opening. Examples of conventional techniques for patterning include, but not limited to, wet etch lithographic processes, dry etch lithographic processes or direct patterning processes.

The base device structure illustrated in FIGS. 3A and 3B may be formed using conventional semiconductor fabrication processes. The base device structure may include an isolation structure 106 and an active region 144 formed on a substrate 102. For example, the isolation structure 106 may be formed by patterning the substrate 102 to form a trench and then depositing silicon dioxide material therein. As shown in FIG. 3A, the isolation structure 106 is formed to surround the active region 144. The active region 144 includes source and drain regions 108, which may be formed using conventional epitaxy techniques and in-situ doping.

As shown in FIG. 3B, a dielectric liner 116 may be formed on the isolation structure 106 using conventional deposition techniques. A reference gate material layer 132 may be formed on the dielectric liner 116 by depositing polysilicon using conventional deposition techniques. The reference gate material layer 132 may be formed such that it is spaced apart from the active region 144 by a spacing S1. Additionally, an insulating layer 130 may be formed on the substrate 102 and covering the reference gate material layer 132 by depositing silicon dioxide using conventional deposition techniques. For simplicity, the insulating layer 130 and the substrate 102 are not shown in FIGS. 3A, 4A, and 5A.

Figure 4A:
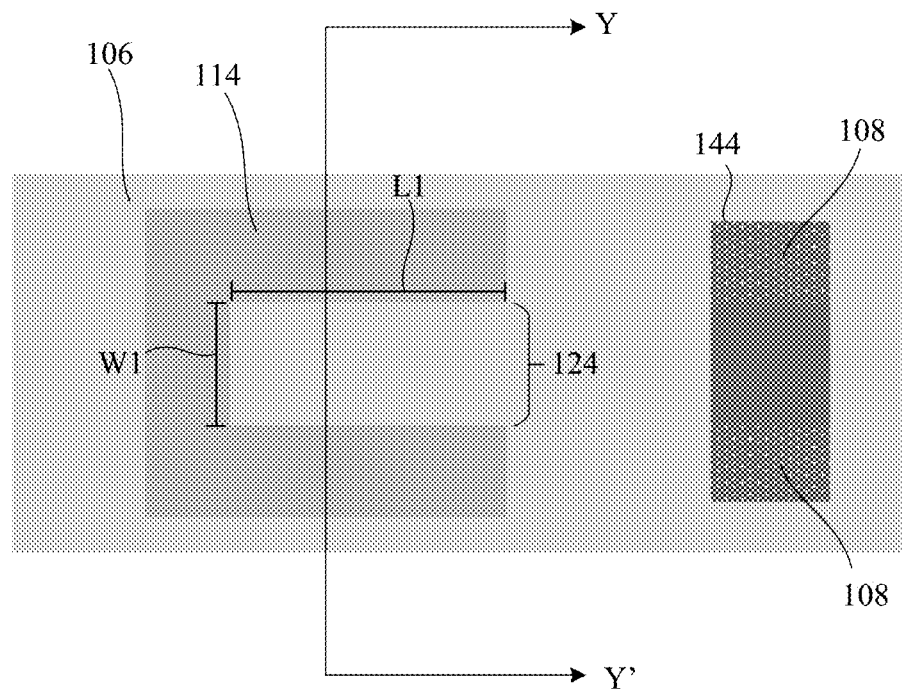
Figure 4B:
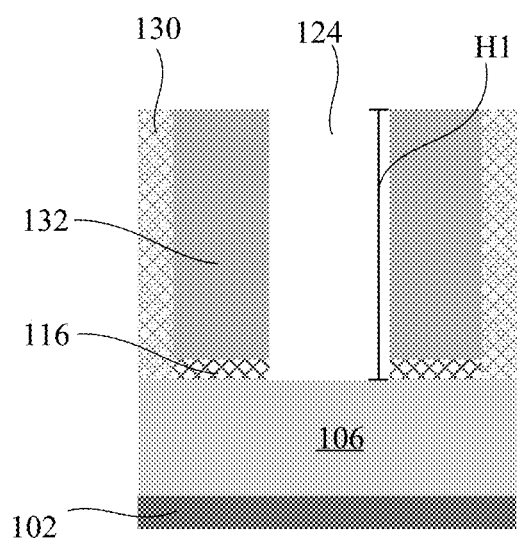

Referring to FIG. 4A and FIG. 4B (FIG. 4A continues from the embodiment shown in FIG. 3A, and FIG. 4B continues from the embodiment shown in FIG. 3B), the reference gate structure 114 is formed by patterning the reference gate material layer using conventional patterning techniques (e.g., a reactive ion etch process).

As shown in FIG. 4A, a cavity 124 is formed in the reference gate structure 114 with a length L1 and a width W1. Additionally, as shown in FIG. 4B, the cavity 124 has a height H1. The length L1, width L1 and height H1 of the cavity 124 may be engineered to provide an optimum surface area contact for coupling between the reference gate structure 114 and the floating gate structure 110, as described herein.

Although not shown in the accompanying drawings, it should be understood that the patterning of the reference gate material layer as described in FIGS. 4A and 4B can be applied similarly to form the illustrative examples of the reference gate structure 114 shown in FIGS. 2B to 2E.

Figure 5A:
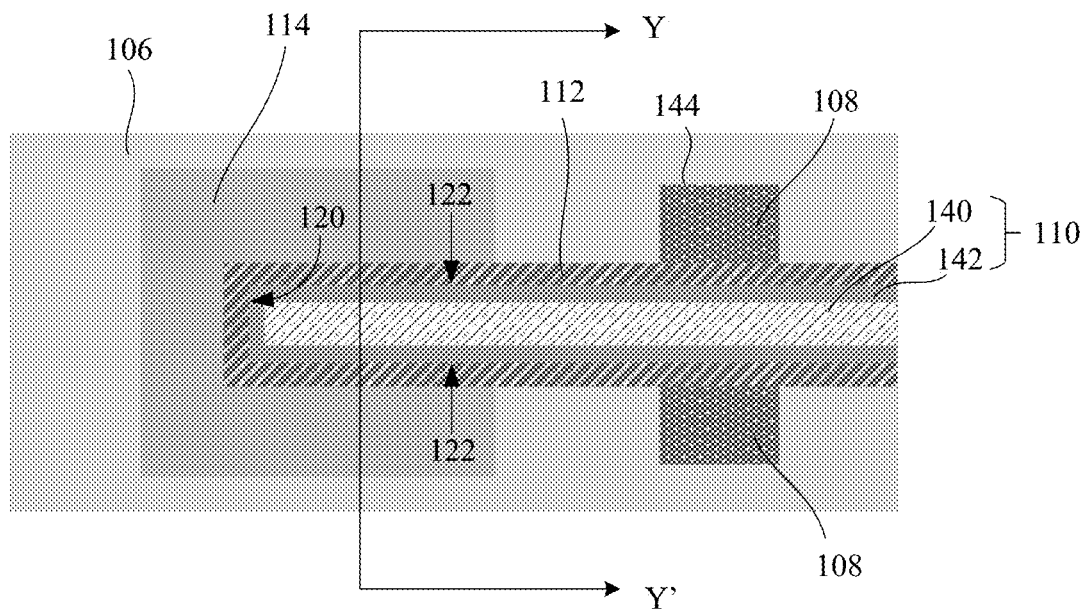
Figure 5B:
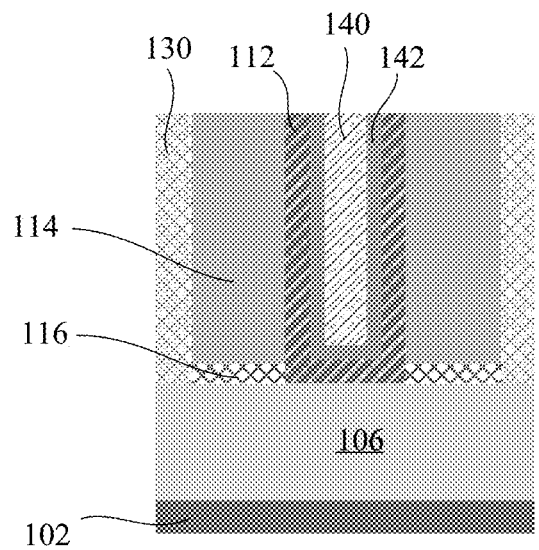

Referring to FIG. 5A and FIG. 5B (FIG. 5A continues from the embodiment shown in FIG. 4A, and FIG. 5B continues from the embodiment shown in FIG. 4B), the dielectric layer 112 and the floating gate structure 110 are formed in the cavity. The dielectric layer 112 may be deposited (using conventional deposition processes) to cover the underlying isolation structure 106 and side surfaces of the reference gate structure 114.

Thereafter, the floating gate structure 110 may be formed using techniques employed in conventional replacement metal gate (RMG) processes. For example, a WFM layer 142 is deposited to conform to the dielectric layer 112, and a metal electrode 140 is deposited on the WFM layer 142.

As described herein, the floating gate structure 110 is formed to have a first portion adjacent to the reference gate structure 114 and separated by the dielectric layer 112 therebetween. Additionally, the floating gate structure 110 extends laterally to have a second portion above and between the source and drain regions 108.

It should be understood that the RMG process is described at this point in the sequence as an example. The RMG process will be apparent to those of ordinary skill in the art without departing from the scope and spirit of this disclosure.

Figure 6:
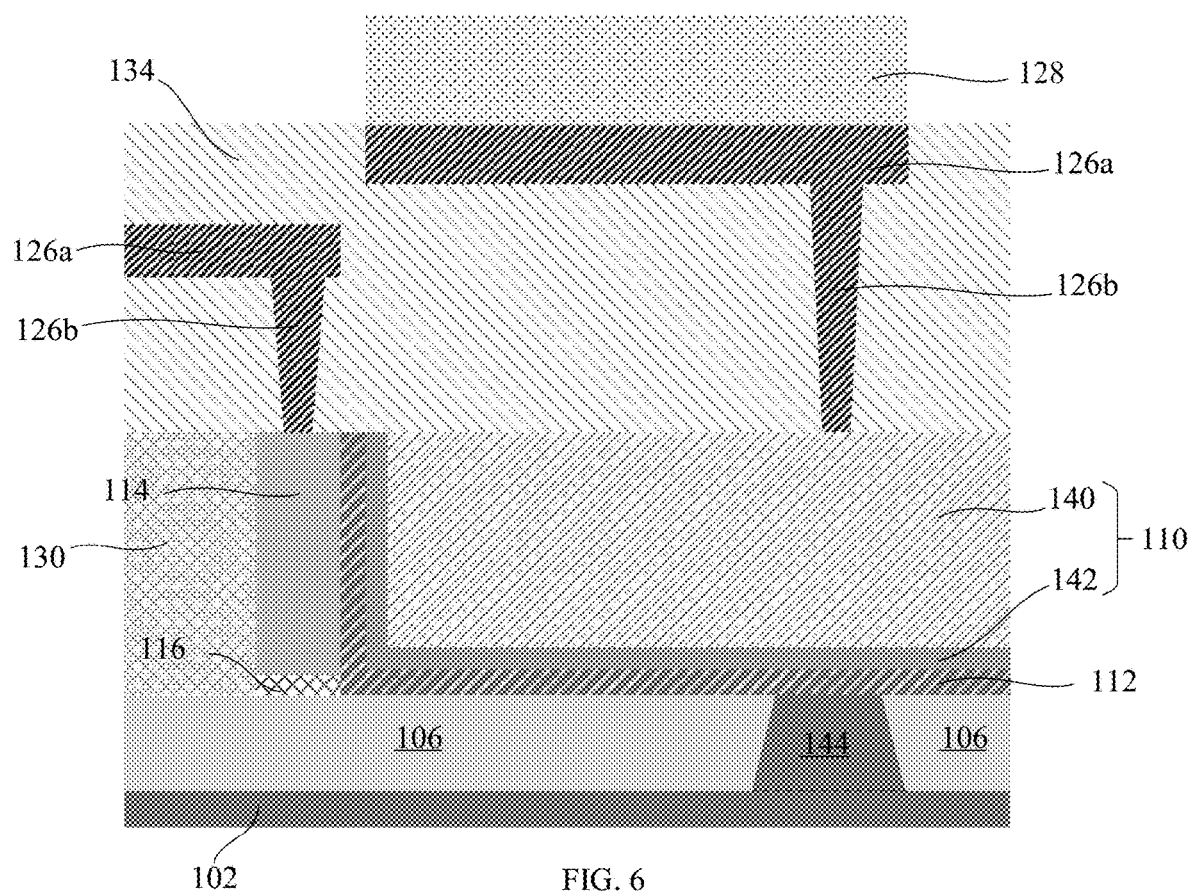
FIG. 6 is a cross-sectional view of another exemplary semiconductor device in accordance with embodiments of the present disclosure.

FIG. 6 illustrates another embodiment of the semiconductor device in accordance with the present disclosure. Interconnect structures, such as conductive lines 126a and interconnect vias 126b, may be formed and embedded within a multilayer dielectric structure 134 to provide routing of electrical signals to and from the semiconductor device of the present disclosure. As shown in FIG. 6, the interconnect vias 126b are formed on the reference gate structure 114 and the floating gate structure 110. The conductive lines 126a, interconnect vias 126b and the multilayer dielectric structure 134 may be formed above the structure shown in FIG. 1 using conventional semiconductor processes, such as a damascene process.

The semiconductor device may further include a sensing layer 128 formed on the multilayer dielectric structure 134, e.g., by conventional deposition techniques. The sensing layer 128 is formed above the floating gate structure 110 and the reference gate structure 114. The sensing layer 128 is electrically connected to the floating gate structure 110 by the interconnect structures. During operation of the device, the sensing layer 128 functions as a sensor for the detection of charged particles and may be made of a metal oxide material, such as aluminum oxide ($Al_2O_3$), silicon dioxide ($SiO_2$), tantalum pentoxide ($Ta_2O_5$), or a nitride material such as silicon nitride ($Si_3N_4$). As described herein, the floating gate structure 110 controls the current flow between the source and drain regions. When the sensing layer 128 detects changes in the ionic concentration of a solution, the potential of the floating gate 110 changes and modulates the read-out current from the source and drain regions.

Figure 7:
FIG. 7 is a circuit diagram representing the exemplary semiconductor device of FIG. 6, in accordance with the present disclosure.

Referring to FIG. 7, a circuit diagram 200 depicting the electrical connections in the exemplary semiconductor device of FIG. 6 is shown. As shown, the circuit diagram 200 includes a sensing layer 228, a reference gate 214, and a floating gate 210. The sensing layer 228 is connected to the floating gate 210. The reference gate 214 has a power supply voltage 298 connected thereto and is electrically coupled to the floating gate 210. The floating gate 210 provides control of current flow from a ground terminal 296 (i.e., a source) to an output terminal 294 (i.e., a drain).

The dielectric layer (not shown in FIG. 7) electrically isolates the floating gate 210 from the reference gate 214. Since the reference gate 214 is biased to a power supply voltage 298 and the floating gate 210 is not connected to any output terminal, the voltage of the floating gate 210 is defined with reference to the reference gate 214. The coupled voltage between the floating gate 210 and the reference gate 214 can be controlled using the coupling ratio of the capacitances of floating gate 210 and the reference gate 214. By positioning the dielectric layer between the reference gate 214 and the floating gate 210, the coupling ratio may be increased by engineering the dielectric constant and the thickness of the dielectric layer, and the surface area contact between the dielectric layer, the reference gate 214 and the floating gate 210.

It is understood that the following disclosure is not limited to any particular type of semiconductor devices. The devices and methods disclosed herein may be applied to any type of semiconductor device architecture, such as tri-gate field-effect transistor (FET) devices, fin-type FET (FinFET) devices or planar-type metal-oxide-semiconductor FET (MOSFET) devices.

Throughout this disclosure, the terms top, upper, upwards, over, and above refer to the direction away from the substrate. Likewise, the terms bottom, lower, downwards, under, and below refer to the direction towards the substrate. It is to be understood that the terms so used are interchangeable under appropriate circumstances such that the embodiments of the device described herein are, for example, capable of operation in other orientations than those illustrated or otherwise described herein.

Similarly, if a method is described herein as involving a series of steps, the order of such steps as presented herein is not necessarily the only order in which such steps may be performed, and certain of the stated steps may possibly be omitted and/or certain other steps not described herein may possibly be added to the method. Furthermore, the terms "comprise", "include", "have", and any variations thereof, are intended to cover a non-exclusive inclusion, such that a process, method, article, or device that comprises a list of elements is not necessarily limited to those elements, but may include other elements not expressly listed or inherent to such process, method, article, or device. Occurrences of the phrase "in an embodiment" herein do not necessarily all refer to the same embodiment.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein. Furthermore, there is no intention to be bound by any theory presented in the preceding background or the following detailed description.

Additionally, the various tasks and processes described herein may be incorporated into a more comprehensive procedure or process having additional functionality not described in detail herein. In particular, various processes in the manufacture of integrated circuits are well-known and so, in the interest of brevity, many conventional processes are only mentioned briefly herein or omitted entirely without providing the well-known process details.

As will be readily apparent to those skilled in the art upon a complete reading of the present disclosure, the methods of forming the semiconductor structure disclosed herein may be employed in manufacturing a variety of different integrated circuit products, including, but not limited to, ion detectors, FinFET transistor devices, CMOS devices, etc.

What is claimed is:

1. A semiconductor device comprising:
   a substrate;
   source and drain regions and an isolation structure disposed on the substrate;
   a reference gate structure disposed above the substrate;
   a floating gate structure extending laterally to include a first portion and a second portion, the first portion being above the isolation structure, wherein the reference gate structure is adjacent to the first portion of the floating gate structure and electrically coupled to the floating gate structure; and
   a dielectric layer having a vertical section layer and a horizontal section layer, wherein the vertical section layer is disposed between the reference gate structure and the first portion of the floating gate structure, and the horizontal section layer is disposed between the isolation structure and a bottom surface of the floating gate structure.

2. The device of claim 1, wherein the horizontal section layer is disposed directly on the isolation structure.

3. The device of claim 1, wherein the reference gate structure laterally surrounds the first portion of the floating gate structure.

4. The device of claim 3, further comprising source and drain regions disposed on the substrate, wherein the second portion of the floating gate structure is disposed above and between the source and drain regions.

5. The device of claim 4, wherein the reference gate structure is spaced apart from the source and drain regions.

6. The device of claim 1, wherein the dielectric layer is disposed on side surfaces, bottom surface and a terminal end surface of the floating gate structure.

7. The device of claim 6, wherein the reference gate structure is adjacent to the terminal end surface of the floating gate structure.

8. The device of claim 6, wherein the reference gate structure is adjacent to a side surface of the first portion of the floating gate structure.

9. The device of claim 8, wherein the reference gate structure is adjacent to the terminal end surface and the side surface of the first portion of the floating gate structure.

10. The device of claim 1, wherein the dielectric layer has a dielectric constant in the range of 4 to 25.

11. The device of claim 1, wherein the dielectric layer has a thickness in the range of 1 nm to 3 nm.

12. The device of claim 1, wherein the reference gate structure includes a semiconductor electrode.

13. The device of claim 1, wherein the floating gate structure includes a metal electrode disposed on a work-function material layer.

14. The device of claim 1, further comprising a sensing layer above the floating gate structure and the reference gate structure, wherein the sensing layer is electrically connected to the floating gate structure.

15. A semiconductor device comprising:
    a substrate;
    source and drain regions and an isolation structure disposed on the substrate;
    a floating gate structure extending laterally to include a first portion above the isolation structure and a second portion above and between the source and drain regions;
    a reference gate structure disposed above the isolation structure and laterally surrounding the first portion of the floating gate structure, wherein the reference gate structure is adjacent and electrically coupled to the floating gate structure; and
    a dielectric layer disposed between the reference gate structure and the first portion of the floating gate structure.

16. The device of claim 15, wherein the dielectric layer is disposed on side surfaces, bottom surfaces and a terminal end surface of the floating gate structure.

17. The device of claim 15, further comprising a sensing layer above the floating gate structure and the reference gate structure, wherein the sensing layer is electrically connected to the floating gate structure.

18. A method of forming a semiconductor device comprising:
    forming an isolation structure and source and drain regions on a substrate;
    forming a reference gate structure above the isolation structure;
    forming a dielectric layer covering the isolation structure and side surfaces of the reference gate structure; and
    forming a floating gate structure extending laterally to include a first portion above the isolation structure and a second portion above and between the source and drain regions, the floating gate structure being formed on the dielectric layer, wherein the first portion of the floating gate structure is adjacent to the side surfaces of the reference gate structure and separated by the dielectric layer therebetween, and wherein the reference gate structure laterally surrounds the first portion of the floating gate structure.

* * * * *